United States Patent [19]

Doi et al.

[11] Patent Number: 4,882,389

[45] Date of Patent: Nov. 21, 1989

[54] ELECTRICAL INSULATING RESIN

[75] Inventors: Makoto Doi; Hiroyukio Nakajima; Fumiyuki Miyamoto; Seiji Oka; Mitsuhiro Nonogaki, all of Amagasaki, Japan

[73] Assignee: Mitsubishi Denki Kabushiki Kaisha, Tokyo, Japan

[21] Appl. No.: 135,078

[22] Filed: Dec. 18, 1987

[30] Foreign Application Priority Data

Jan. 12, 1987 [JP] Japan .................................. 62-4281
Jan. 12, 1987 [JP] Japan .................................. 62-4282

[51] Int. Cl.⁴ ..................... C08F 279/02; C08F 265/06
[52] U.S. Cl. ..................... 525/310; 525/313; 525/263; 525/288; 525/305
[58] Field of Search ............................... 525/310, 313

[56] References Cited

U.S. PATENT DOCUMENTS 3,644,584  2/1972  Fryd ..................................... 525/310
4,268,433  5/1981  Sawatari et al. ..................... 525/310

Primary Examiner—John C. Bleutge
Assistant Examiner—Susan Berman
Attorney, Agent, or Firm—Oblon, Spivak, McCelland, Maier & Neustadt

[57] ABSTRACT

A resin having a low dielectric constant obtained by heat-curing 100 parts by weight of a butadiene polymer containing in its polymer chain at least 50 mol% of a 1,2-butadiene unit having a double bond in its side chain and from 10 to 100 parts by weight of a vinyl compound having at least 3 vinyl groups in one molecule in the presence of an organic peroxide. Also disclosed is a resin having flame resistance obtained by heat-curing a blend of an organic peroxide with a composition comprising 100 parts by weight of a butadiene polymer containing in its polymer chain at least 50 mol% of a 1,2-butadiene unit having a double bond in its side chain, from 10 to 100 parts by weight of a vinyl compound having at least 3 vinyl groups in one molecule and at least one member selected from the compounds of the formulas I-IV:

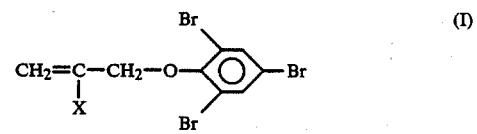

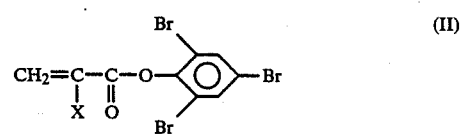

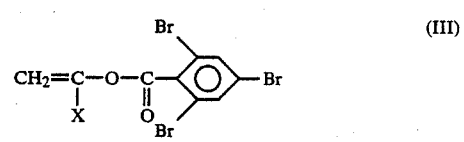

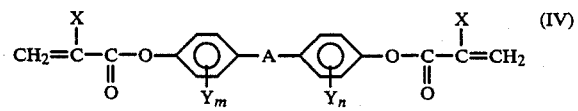

wherein X is H or $CH_3$, Y is Br or Cl, A is —, —O—, —CO—, $SO_2$, —CH=CH—, —C(CH$_3$)$_2$—or —(C-H$_{2a}$—, and each of m, n and a is an integer of from 1 to 4, in an amount of from 25 to 100 parts by weight in the case of the formulas I to III and from 25 to 200 parts by weight in the case of the formula IV.

5 Claims, No Drawings

ELECTRICAL INSULATING RESIN

BACKGROUND OF THE INVENTION

1. Field of the Invention

The present invention relates to an electrical insulating resin. More specifically, it relates to an electrical insulating resin having excellent electrical properties and excellent heat resistance and thus being useful for a laminate sheet such as a printed circuit board.

2. Discussion of Background

Heretofore, 1,2-polybutadiene, which has excellent dielectric property, heat resistance and moisture resistance, has been widely used in the field of electrical insulation. More specifically, 1,2-polybutadiene has been known as a material having excellent electrical properties, particularly a low dielectric constant and a small dielectric dissipation factor, and excellent heat resistance, moisture resistance and chemical resistance. Thus, it has been applied to electronic or electric parts such as a printed circuit board, a printed circuit coating resin, a molding compound and an insulating varnish.

However, the molecule of 1,2-polybutadiene is nonpolar, and its adhesive property with a filler, a reinforcing agent or a metal is inadequate. Further, 1,2-polybutadiene is poor in dimensional stability. In particular, its heat expansion is large. Thus, it can hardly exhibit its excellent heat resistance adequately. Various modified 1,2-polybutadiene have been proposed to solve such problems. However, the modified 1,2-polybutadienes have drawbacks that their reactivities are poor and their curing rates are low, or even when their reactivities are comparable to the non-modified polybutadienes, a problem still remains that the excellent properties specific to the 1,2-polybutadiene homopolymers can not adequately be maintained by the modification. (For example, Japanese Unexamined Patent Publication No. 188353/1982 and No. 188354/1982)

At present, a glass epoxy laminate sheet is commonly used for printed circuit boards for electronic devices and equipment. The high densification of the packaging density and wiring patterns, and the progress of the packaging form, have been accompanied by an increase in the amount of heat generation which is problematic. Therefore, it is important to improve the heat resistance of the substrate itself. Further, the signal delaying time in a pattern of such a substrate is prolonged in proportion to the square root of the dielectric constant thereof. Accordingly, a conventional printed circuit board having a high dielectric constant is not suitable for speed up of a signal in a high density circuit, particularly for high speed switching thereof since it has a problem in the acting speed or in the cross-talk between signal lines. Therefore, it is strongly desired to lower the dielectric constant of the substrate.

It is therefore a first object of the present invention to solve such problems and to provide a low dielectric resin which has low heat expandability, excellent heat resistance and the properties comparable to the conventional glass epoxy substrate, and which is capable of remarkably improving the dielectric constant.

Further, reflecting a recent trend, the electronic and electric parts are required to meet a certain standard for flame resistance from the viewpoint of fire prevention. Thus, the flame resistance is one of important properties which must be taken into account in the development and commercialization of the electronic and electric parts. The same applies to the printed circuit boards, and they are required to have flame resistance of a level of 94 V-O as defined by UL Standard. Under such circumstances, it can not be denied that 1,2-polybutadiene is inflammable since its molecular structure consists solely of carbon and hydrogen atoms. Therefore, it is necessary to impart flame resistance to 1,2-polybutadiene. However, this must be done without impairing the excellent dielectric properties and heat resistance which 1,2-polybutadiene essentially has.

When a conventional flame retarder is added to 1,2-polybutadiene to obtain a composition having flame resistance, the flame retarder may be selected from the relatively wide range. However, it is required to use a large amount of the flame retarder, and in many cases, various essential properties of the resin will thereby be offset, and there will be substantial deterioration in the heat resistance or in the weather resistance of the resin. For example, a method for making 1,2-polybutadiene flame resistant by using an additional type flame retarder such as hexabromobenzene, decanebromodiphenyl ether, triphenyl phosphate or dechlorane, if necessary, with an addition of a flame retarder assistant such as antimony trioxide or triphenylantimony, not only impairs the excellent essential dielectric properties or heat resistance of the 1,2-polybutadiene, but also brings about many drawbacks such as bleeding out of the flame retarder to the surface of the resin, etc.

It is therefore another object of the present invention to solve such problems, and to provide a flame resistant resin having excellent heat resistance and the properties comparable to the conventional glass epoxy substrate and having flame resistance imparted thereto by forming a polymer network firmer than a 1,2-polybutadiene homopolymer.

According to a first aspect, the present invention provides a resin having a low dielectric constant obtained by heat-curing 100 parts by weight of a butadiene polymer containing in its polymer chain at least 50 mol% of a 1,2-butadiene unit having a double bond in its side chain and from 10 to 100 parts by weight of a vinyl compound having at least 3 vinyl groups in one molecule in the presence of an organic peroxide.

According to a second aspect, the present invention provides a resin having flame resistance obtained by heat-curing a blend of an organic peroxide with a composition comprising 100 parts by weight of a butadiene polymer containing in its polymer chain at least 50 mol% of a 1,2-butadiene unit having a double bond in its side chain, from 10 to 100 parts by weight of a vinyl compound having at least 3 vinyl groups in one molecule and at least one member selected from the compounds of the formulas I-IV:

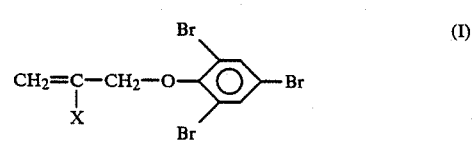

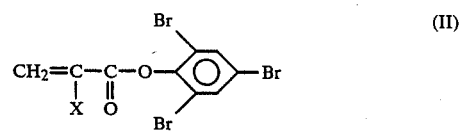

-continued

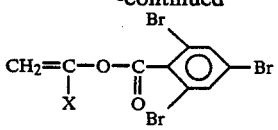

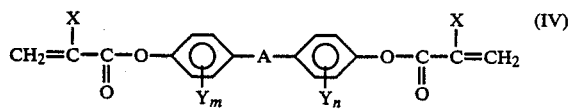

wherein X is H or $CH_3$, Y is Br or Cl, A is —, —O—, —CO—, —$SO_2$—, —CH=CH—, —$C(CH_3)_2$— or —$(CH_2)_a$—, and each of m, n and a is an integer of from 1 to 4, in an amount of from 25 to 100 parts by weight in the case of the formulas I to III and from 25 to 200 parts by weight in the case of the formula IV.

Now, the present invention will be described in detail with reference to the preferred embodiments.

In the present invention, the butadiene polymer is preferably the one which has in its polymer chain at least 50 mol% of a 1,2-butadiene unit and a number average molecular weight of from 1,000 to 200,000. Particularly preferred is the one having in its polymer chain at least 90 mol% of a 1,2-butadiene unit, a number average molecular weight of from 50,000 to 200,000 and thermoplasticity with a melting point of from 50° to 200° C. For example, JSR RB-810, RB-820 and RB-830 (tradenames, manufactured by Japan Synthetic Rubber Co. Ltd.), may be mentioned.

The vinyl compound used in the present invention is the one containing at least 3 vinyl groups in one molecule. As such a vinyl compound, trimethylolpropane triacrylate, trimethylolpropane trimethacrylate, a triallyl trimellitate, trihydroxyethylisocyanuric acid triacrylate and trihydroxyethylisocyanuric acid trimethacrylate, may be mentioned.

As regards the blend ratio of the butadiene polymer and the vinyl compound in the present invention, the amount of the vinyl compound is within a range of from 10 to 100 parts by weight, relative to 100 parts by weight of the butadiene polymer. If the amount of the vinyl compound is less than 10 parts by weight, the adhesive property of the resin tends to deteriorate, or the heat expansibility tends to increase. If it exceeds 100 parts by weight, the dielectric property tends to deteriorate.

Then, the low dielectric resin of the present invention, can be obtained in the following manner. Namely, a mixture of a 1,2-butadiene polymer and a vinyl compound having at least 3 vinyl groups, is dissolved in an organic solvent such as benzene, toluene, xylene, cyclohexane, chloroform, dimethylformamide or dimethylacetamide. An organic peroxide selected from the group consisting of dicumyl peroxide, t-butylperbenzoate, t-butylperoxylaurate and benzoyl peroxide, as a vinyl polymerization initiator, is added thereto, followed by heat-curing, to obtain a low dielectric resin.

The low dielectric resin thus obtained is useful as an electrical material such as an insulating material, particularly useful for a laminate sheet such as a printed circuit board. The laminate sheet can be prepared in the following manner. The above-mentioned resin mixture is dissolved in an organic solvent, and an organic peroxide is added thereto to prepare a varnish for impregnation, which is then impregnated into a base material, such as a woven fabric or a nonwoven fabric made of an inorganic or organic fiber such as a glass fiber or a synthetic fiber. Then, the solvent is distilled off at a temperature of from 80° to 180° C. for from 5 to 60 minutes, to obtain a prepreg sheet. A plurality of such prepreg sheets are overlaid one on another as required, and subjected to lamination molding at a predetermined temperature under a predetermined pressure, to obtain a laminate sheet. A copper foil may be overlaid on one or each side of the laminate sheet and subjected to lamination molding, to obtain a copper-clad laminate sheet. The resin and the laminate sheet thus obtained, are excellent in various properties such as the heat resistance, and particularly excellent in the low dielectric constant.

The low dielectric resin of the present invention, is a resin obtained by heat-curing a butadiene polymer containing in its polymer chain at least 50 mol% of a 1,2-butadiene unit having a double bond in its side chain and a vinyl compound having at least 3 vinyl groups in one molecule, and it is believed that the resin has a much improved dielectric constant in addition to the properties comparable to the conventional epoxy resin or the like because a polybutadiene network having an excellent dielectric property, is cross-linked by the vinyl compound in good balance.

Now, a flame resistant resin according to the second aspect of the present invention will be described. As a reaction-type flame retarder to impart flame resistance, the 2,4,6-tribromophenyl compounds represented by the formulas I, II and III, include, for example, 2,4,6-tribromophenyl acrylate, 2,4,6-tribromophenyl methacrylate, 2,4,6-tribromophenyl aryl ether and 2,4,6-tribromobenzoic acid. The compounds having two acryloyl groups or two methacryloyl groups represented by the formula IV, include, for example,
2,2-bis(4-methacryloyl-3,5-dibromophenyl)propane,
2,2-bis(4-acryloyl-3,5-dibromophenyl)propane,
2,2-bis(4-methacryloyl-3,5-dichlorophenyl)propane,
2,2-bis(4-acryloyl-3,5-dichlorophenyl)propane,
4,4'-diacryloyl-3,3',5,5'-tetrabromodiphenylmethane,
4,4'-dimethacryloyl-3,3',5,5'-tetrabromodiphenylmethane,
4,4'-diacryloyl-3,3'-dichlorodiphenylsulfone,
4,4'-dimethacryloyl-3,3'-dibromodiphenylbutane,
4,4'-dimethacryloyl-2,2',3,3',5,5',6,6'-octachlorophenyl ether and 4,4'-diacryloyl-2,2',5,5'-tetrachlorodiphenyl, may be mentioned.

The blend ratio of the reaction-type flame retarder, is within a range of from 25 to 100 parts by weight in the case of the compounds of the formulas I, II and III and from 25 to 200 parts by weight in the case of the compounds of the formula IV, relative to 100 parts by weight of the butadiene polymer. If the blend ratio of the compounds of the formulas I to IV, is less than 25 parts by weight, they do not substantially contribute to improving the flame resistance, and if it exceeds 100 parts by weight in the case of the compounds of the formulas I to III or 200 parts by weight in the case of the compounds of the formula IV, the dielectric property tends to be inferior.

The flame resistant resin of the present invention can be prepared in the following manner. Namely, the butadiene polymer, the vinyl compound having at least 3 vinyl groups in one molecule and at least one member selected from the compounds of the formulas I to IV, are dissolved in an organic solvent such as toluene, xylene, n-hexane, cyclohexane, chloroform, 2-butanone, dimethylformamide and methylcellosolve, and then, an organic peroxide such as dicumyl peroxide, t-butylperoxylaurate, t-butylperbenzoate and benzoyl peroxide, as a vinyl polymerization initiator, is added thereto, followed by heat-curing, to obtain a flame resistant resin.

The flame resistant resin thus obtained is useful as an electrical material such as an insulating material, particularly useful for a laminate sheet such as a printed circuit board. The laminate sheet can be prepared in the following manner. The above-mentioned resin mixture is dissolved in an organic solvent, and an organic peroxide is added thereto to obtain a varnish for impregnation, which is then impregnated into a base material, such as a woven fabric or a nonwoven fabric made of an inorganic or organic fiber such as a glass fiber and a synthetic fiber. Then, the solvent is distilled off at a temperature of from 80° to 180° C. for from 5 to 60 minutes, to obtain a prepreg sheet. A plurality of prepreg sheets are overlaid one on another as required, and subjected to lamination molding at a predetermined temperature under a predetermined pressure, to obtain a laminate sheet. A copper foil may be overlaid on one or each side of the laminate sheet and subjected to lamination molding, to obtain a copper-clad laminate sheet. The resin and the laminate sheet thus obtained, are excellent in various properties such as heat resistance and particularly excellent in the flame resistance.

The flame resistant resin of the present invention, is a resin obtained by heat-curing a butadiene polymer containing in its polymer chain at least 50 mol% of a 1,2-butadiene unit having a double bond in its side chain, a vinyl compound having at least 3 vinyl groups in one molecule and at least one member selected from the 2,4,6-tribromophenyl compounds of the formulas I, II and III or the compound of the formula IV, and it is believed that the resin has much improved flame resistance in addition to the properties comparable to the conventional epoxy resin or the like, because a polybutadiene network having excellent heat resistance is cross-linked by the compound having excellent flame resistance and the vinyl compound in good balance.

Now, the present invention will be described in further detail with reference to Examples. However, it should be understood that the present invention is by no means restricted to such specific Examples.

EXAMPLE 1

70 g of a syndiotactic 1,2-polybutadiene containing in its polymer chain about 90 mol% of a 1,2-butadiene unit (JSR RB-810, tradename, manufactured by Japan Synthetic Rubber CO., Ltd., number average molecular weight: about 100,000), 30 g of a trihydroxyethylisocyanuric acid triacrylate (FA-731A, tradename, manufactured by Hitachi Kasei K.K.) and 4 g of dicumyl peroxide, were dissolved in 350 g of toluene, and the solution was poured into an aluminum mold. The solvent was distilled off at a temperature of 60° C. while degassing under vacuum, and then, the heat-curing was conducted in 3-steps at temperatures of 120° C., 150° C. and 180° C. each for 2 hours, i.e. for a total of 6 hours. After cooling, the cured product was taken out from the mold. The dielectric constant, dielectric dissipation factor, heat expandability and glass-transition point of the cured product thus obtained, were measured, and the results are shown in Table 1.

EXAMPLE 2

90 g of the syndiotactic 1,2-polybutadiene containing in its polymer chain about 90 mol% of a 1,2-butadiene unit (as described in Example 1), 10 g of a trihydroxyethylisocyanuric acid trimethacrylate (FA-731M, tradename, manufactured by Hitachi Kasei K.K.) and 2 g of dicumyl peroxide, were dissolved in 450 g of toluene, and the solution was poured into an aluminum mold. The solvent was distilled off at a temperature of 60° C. while degassing under vacuum, and then, the heat-curing was conducted in 3-steps at temperatures of 120° C., 150° C. and 180° C. each for 2 hours, i.e. for a period of 6 hours. After cooling, the cured product was taken out from the mold. The properties of the cured product thus obtained, were measured in the same manner as in Example 1, and the results are shown in Table 1.

EXAMPLE 3

50 g of the syndiotactic polybutadiene containing in its polymer chain about 90 mol% of a 1,2-butadiene unit (as described in Example 1), 50 g of the trihydroxyethylisocyanuric acid triacrylate (as described in Example 2) and 2 g of dicumyl peroxide, were dissolved in 250 g of toluene, and the solution was poured into an aluminum mold. The solvent was distilled off at a temperature of 60° C. while degassing under vacuum, and then the heat-curing was conducted at temperatures of 120° C. and 150° C. each for two hours, and at a temperature of 180° C. for 1.5 hours, for a total of 5.5 hours. After cooling, the cured product was taken out from the mold. The properties of the cured product thus obtained were measured in the same manner as in Example 1, and the results are shown in Table 1.

COMPARATIVE EXAMPLE 1

100 g of the syndiotactic 1,2-polybutadiene as described in Example 1 and 2 g of dicumyl peroxide, were dissolved in 500 g of toluene, and the solution was poured into an aluminum mold. Then, the same operation as in Example 2 was conducted to obtain a cured product. The properties of the cured product were measured in the same manner, and the results are shown in Table 1.

COMPARATIVE EXAMPLE 2

100 g of bisphenol A type epoxy compound (DER-332, tradename, manufactured by Dow Chemical Company Limited, number average molecular weight: about 400) and 4 g of dicyandiamide, were dissolved in 40 g of dimethylformamide, and the solution was poured into an aluminum mold. Then, the same operation as in Example 2 was conducted to obtain a cured product. The properties of the cured product were measured in the same manner, and the results are shown in Table 1.

TABLE 1

| Property | Measurement Condition | Examples | | | Comparative Examples | |
| --- | --- | --- | --- | --- | --- | --- |
| | | 1 | 2 | 3 | 1 | 2 |
| Dielectric Constant | JIS K6911 | 2.86 | 2.76 | 3.32 | 2.50 | 4.22 |
| Dielectric Dissipation | JIS K6911 | $9.2 \times 10^{-3}$ | $5.6 \times 10^{-3}$ | $1.4 \times 10^{-2}$ | $4.5 \times 10^{-3}$ | $1.5 \times 10^{-2}$ |

TABLE 1-continued

| Property | Measurement Condition | Examples | | | Comparative Examples | |
|---|---|---|---|---|---|---|
| | | 1 | 2 | 3 | 1 | 2 |
| Factor | | | | | | |
| Heat Expandability ($\mu$m/m · °C.) | TMA method (mean value to Tg) | 90 | 143 | 122 | 405 | 68 |
| Glass-Transition Point (°C.) | TMA method (2.5° C./min) | 205 | 47 | 249 | 42 | 93 |

EXAMPLE 4

70 g of the polybutadiene and 30 g of the trihydroxyethylisocyanuric acid triacrylate as described in Example 1, and 4 g of dicumyl peroxide, were dissolved in 280 g of toluene to obtain a varnish. The varnish was impregnated into a glass cloth. Then, the glass cloth was dried at a temperature of 130° C. for 10 minutes to obtain a prepreg sheet having no tackiness.

then, 8 such prepreg sheets were overlaid one on another and further, a copper foil was overlaid on each of the top and the bottom of the overlaid sheets, followed by press-molding at a temperature of 180° C. under 40 kg/cm³ for 90 minutes, to obtain a copper-clad laminate sheet. The dielectric constant, dielectric dissipation factor, soldering heat resistance and trichlene resistance of the laminate sheet thus obtained, were measured, and the results are shown in Table 2.

EXAMPLE 5

90 g of the 1,2-polybutadiene as described in Example 1, 10 g of the trihydroxyethylisocyanuric acid trimethacrylate as described in Example 2 and 2 g of dicumyl peroxide, were dissolved in 360 g of toluene to obtain a varnish. The varnish was impregnated into a glass cloth. The glass cloth was dried at a temperature of 140° C. for 5 minutes to obtain a prepreg sheet having no tackiness. The subsequent operation was conducted in the same manner as in Example 4 to obtain a copper-clad laminate sheet. The properties of the laminate sheet were measured in the same manner, and the results are shown in Table 2.

EXAMPLE 6

50 g of the 1,2-polybutadiene and 50 g of the trihydroxyisocyanuric acid triacrylate, as described in Example 1, and 2 g of dicumyl peroxide, were dissolved in 200 g of toluene to obtain a varnish. The subsequent operation was conducted in the same manner as in Example 4 to obtain a copper-clad laminate sheet. The properties of the laminate sheet were measured in the same manner, and the results are shown in Table 2.

COMPARATIVE EXAMPLE 3

100 g of the 1,2-polybutadiene as described in Example 1 and 3 g of dicumyl peroxide, were dissolved in 400 g of toluene to obtain a varnish. The varnish was impregnated into glass cloth, and then, the glass cloth was dried at a temperature of 120° C. for 10 minutes to obtain a prepreg sheet having no tackiness. The subsequent operation was conducted in the same manner as in Example 4 to obtain a copper-clad laminate sheet. The properties of the laminate sheet were measured in the same manner, and the results are shown in Table 2.

COMPARATIVE EXAMPLE 4

100 g of the epoxy compound as described in Comparative Example 2 and 4 g of dicyandiamide, were dissolved in 40 g of dimethylformamide to obtain a varnish. The varnish was impregnated into a glass cloth, and then, the glass cloth was dried at a temperature of 130° C. for 10 minutes to obtain a prepreg sheet having no tackiness. The subsequent operation was conducted in the same manner as in Example 4 to obtain a copper-clad laminate sheet. The properties of the laminate sheet were measured in the same manner, and the results are shown in Table 2.

TABLE 2

| Property | Measurement Condition | Examples | | | Comparative Examples | |
|---|---|---|---|---|---|---|
| | | 4 | 5 | 6 | 3 | 4 |
| Dielectric Constant | JIS C6481 | 3.42 | 3.31 | 3.95 | 3.16 | 4.98 |
| Dielectric Dissipation Factor | JIS C6481 | $1.0 \times 10^{-2}$ | $6.0 \times 10^{-3}$ | $1.7 \times 10^{-2}$ | $5.0 \times 10^{-3}$ | $1.9 \times 10^{-2}$ |
| Soldering Heat Resistance | 260° C. for 180 sec | no change | no change | no change | expansion | no change |
| Trichlene Resistance | | no change | no change | no change | no change | no change |

EXAMPLE 7

80 g of a syndiotactic 1,2-polybutadiene containing in its polymer chain about 90 mol% of 1,2-butadiene unit (JSR RB-810, tradename, manufactured by Japan Synthetic Rubber Co., Ltd., number average molecular weight: about 150,000), 20 g of a trihydroxyethylisocyanuric acid triacrylate (FA-731A, tradename, manufactured by Hitachi Kasei K.K.), 35 g of 2,4,6-tribromophenyl acrylate and 5 g of dicumyl peroxide, were dissolved in 400 g of toluene, and the solution was poured into an aluminum mold. The solvent was distilled off at a temperature of 60° C. while degassing under vacuum, and then, the heat-curing was conducted in 3-steps at temperatures of 120° C., 150° C. and 180° C. each for 2 hours, i.e. for a total of 6 hours. After cooling, the cured product was taken out from the mold. The dielectric constant, dielectric dissipation factor, heat expandability and glass-transition point of the cured product thus obtained, were measured, and the results are shown in Table 3.

EXAMPLE 8

85 g of the syndiotactic 1,2-polybutadiene containing in its polymer chain about 90 mol% of a 1,2-butadiene unit (as described in Example 7), 15 g of a trihydroxyethylisocyanuric acid trimethacrylate (FA-731M, tradename, manufactured by Hitachi Kasei K.K.), 55 g of a 2,2-bis(4-methacryloyl-3,5-dibromophenyl)propane (manufactured by Dai-ichi Kogyo Seiyaku Co., Ltd.) and 2 g of dicumyl peroxide, were dissolved in 430 g of toluene, and the solution was poured into an aluminum mold. The solvent was distilled off at a temperature of 60° C. while degassing under vacuum, and then, the heat-curing was conducted in 3-steps at temperatures of 120° C., 150° C. and 180° C. each for 2 hours, i.e. for a total of 6 hours. After cooling, the cured product was taken out from the mold. The properties of the cured product thus obtained, were measured in the same manner as in Example 7, and the results are shown in Table 3.

EXAMPLE 9

90 g of the syndiotactic 1,2-polybutadiene containing in its polymer chain about 90 mol% of a 1,2-butadiene unit (as described in Example 7), 10 g of the trihydroxyethylisocyanuric acid triacrylate (as described in Example 8), 35 g of 2,4,6-tribromophenyl acrylate and 6 g of dicumyl peroxide, were dissolved in 450 g of toluene, and the solution was poured into an aluminum mold. The solvent was distilled off at a temperature of 60° C. while degassing under vacuum, and then, the heat-curing was conducted in 3-steps at temperatures of 120° C. and 150° C. each for 2 hours, and at a temperature of 180° C. for 1.5 hours, for a total of 5.5 hours. After cooling, the cured product was taken out from the mold. The properties of the cured product thus obtained, were measured in the same manner as in Example 7, and the results are shown in Table 3.

COMPARATIVE EXAMPLE 5

100 g of the 1,2-polybutadiene as described in Example 7 and 2.5 g of dicumyl peroxide, were dissolved in 500 g of toluene, and the solution was poured into an aluminum mold. The subsequent operation was conducted in the same manner as in Example 7 to obtain a cured product. The properties of the cured product thus obtained, were measured in the same manner as in Example 7, and the results are shown in Table 3.

COMPARATIVE EXAMPLE 6

100 g of a bisphenol A type epoxy resin (DER-332, tradename, manufactured by Dow Chemical Co., Ltd., number average molecular weight: about 350) and 4 g of dicyandiamide, were dissolved in 40 g of methylformamide, and the solution was poured into an aluminum mold. The subsequent operation was conducted in the same manner as in Example 7 to obtain a cured product, and the properties of the cured product were measured in the same manner, and the results are shown in Table 3.

TABLE 3

| Property | Measurement Condition | Examples | | | Comparative Examples | |
|---|---|---|---|---|---|---|
| | | 7 | 8 | 9 | 5 | 6 |
| Dielectric Constant | JIS K6911 | 3.02 | 3.11 | 2.90 | 2.50 | 4.22 |
| Dielectric Dissipation Factor | JIS K6911 | $1.1 \times 10^{-2}$ | $1.2 \times 10^{-2}$ | $8.9 \times 10^{-3}$ | $4.5 \times 10^{-3}$ | $1.5 \times 10^{-2}$ |
| Heat Expandability ($\mu$m/m · °C.) | TMA method (mean value to Tg) | 105 | 108 | 112 | 390 | 68 |
| Glass-transition point (°C.) | TMA method (2.5° C./min) | 165 | 152 | 172 | 44 | 118 |

EXAMPLE 10

70 g of the 1,2-polybutadiene and 30 g of the trihydroxyethylisocyanuric acid triacrylate, as described in Example 7, 35 g of 2,4,6-tribromophenyl acrylate and 4 g of dicumyl peroxide, were dissolved in 350 g of toluene to obtain a varnish. The varnish was impregnated into a glass cloth, and then, the glass cloth was dried at a temperature of 130° C. for 10 minutes to obtain a prepreg sheet having no tackiness.

Then, 8 such prepreg sheets were overlaid one on another and a copper foil was overlaid on each of the top and the bottom of the overlaid sheets, followed by press-molding at a temperature of 180° C. under 40 kg/cm³ for 90 minutes, to obtain a copper-clad laminate sheet. The dielectric constant, dielectric dissipation factor, soldering heat resistance and trichlene resistance of the laminate sheet thus obtained, were measured, and the results are shown in Table 4.

EXAMPLE 11

90 g of the 1,2-polybutadiene, 10 g of the trihydroxyethylisocyanuric acid trimethacrylate and, 55 g of the 2,2-bis(4-methacryloyl-3,5-dibromophenyl)propane as described in Example 8, and 3 g of dicumyl peroxide, were dissolved in 450 g of toluene to obtain a varnish. The varnish was impregnated into a glass cloth, and the glass cloth was dried at a temperature of 140° C. for 5 minutes to obtain a prepreg sheet having no tackiness. Then, 8 such prepreg sheets were overlaid one on another and a copper foil was overlaid on each of the top and the bottom of the overlaid sheets, followed by press-molding at a temperature of 180° C. under 40 kg/cm³ for 90 minutes, to obtain a copper-clad laminate sheet. The properties of the laminate sheet thus obtained, were measured in the same manner as in Example 10, and the results are shown in Table 4.

EXAMPLE 12

95 g of the 1,2-polybutadiene and 5 g of the trihydroxyethylisocyanuric acid triacrylate as described in Example 7, 35 g of 2,4,6-tribromophenyl acrylate and 6 g of dicumyl peroxide, were dissolved in 480 g of toluene to obtain a varnish. The subsequent operation was conducted in the same manner as in Example 10 to obtain a laminate sheet. The properties of the laminate sheet were measured in the same manner, and the results are shown in Table 4.

COMPARATIVE EXAMPLE 7

100 g of the 1,2-polybutadiene as described in Example 7 and 2.5 g of dicumyl peroxide, were dissolved in 500 g of toluene to obtain a varnish. The varnish was impregnated into a glass cloth, and then, the glass cloth was dried at a temperature of 120° C. for 10 minutes to obtain a prepreg sheet having no tackiness. The subsequent operation was conducted in the same manner as in Example 10, to obtain a laminate sheet. The properties of the laminate sheet thus obtained, were measured in the same manner, and the results are shown in Table 4.

COMPARATIVE EXAMPLE 8

100 g of the epoxy resin as described in Comparative Example 6 and 4 g of dicyandiamide, were dissolved in 40 g of dimethylformamide to obtain a varnish. The varnish was impregnated into a glass cloth, and then, the glass cloth was dried at a temperature of 150° C. for 5 minutes to obtain a prepreg sheet having no tackiness. Then subsequent operation was conducted in the same manner as in Example 10, to obtain a laminate sheet. The properties of the laminate sheet thus obtained, were measured in the same manner, and the results are shown in Table 4.

TABLE 4

| Property | Measurement Condition | Examples | | | Comparative Examples | |
|---|---|---|---|---|---|---|
| | | 10 | 11 | 12 | 7 | 8 |
| Dielectric Constant | JIS C6481 | 3.85 | 3.68 | 3.48 | 3.16 | 4.98 |
| Dielectric Dissipation Factor | JIS C6481 | $1.5 \times 10^{-2}$ | $1.3 \times 10^{-2}$ | $1.0 \times 10^{-2}$ | $5.0 \times 10^{-3}$ | $1.9 \times 10^{-2}$ |
| Soldering Heat Resistance | 260° C. for 200 sec | no change | no change | no change | blister | no change |
| Trichlene Resistance | | no change | no change | no change | no change | no change |

As is apparent from Tables 1 to 4, the present invention remarkably improves the properties of Comparative Examples and is capable of satisfying the required properties.

According to the present invention, a polymer network firmer than a 1,2-polybutadiene homopolymer, is formed by heat-curing a butadiene polymer containing in its polymer chain at least 50 mol% of a 1,2-butadiene unit and a vinyl compound having at least 3 vinyl groups in one molecule. Therefore, the resin of the present invention has not only excellent heat resistance, low heat expansibility and advantageous properties comparable to the conventional substrate made of an epoxy resin, but also remarkably improved electrical properties.

Further, according to another aspect of the present invention, it is possible to obtain a resin having not only excellent heat resistance, low heat expandability and advantageous properties comparable to the conventional substrate made of an epoxy resin, but also remarkably improved flame resistance, by reacting a butadiene polymer containing in its polymer chain at least 50 mol% of a 1,2-butadiene unit, a vinyl compound having at least 3 vinyl groups in one molecule and a compound of the formula I, II, III or IV.

What is claimed is:

1. A resin obtained by heat-curing 100 parts by weight of a butadiene polymer containing in its polymer chain at least 50 mol% of 1,2-butadiene units having a double bond in each unit in its side chain and from 10 to 100 parts by weight of a vinyl compound having at least 3 vinyl groups per molecule selected from the group consisting of trimethylolpropane triacrylate, trimethylolpropane trimethacrylate, triallyltrimellitate, trihydroxyethylisocyanuric acid triacrylate and trihydroxyethylisocyanuric acid trimethacrylate in the presence of an organic peroxide.

2. The resin according to claim 1, wherein the butadiene polymer has a number average molecular weight of from 1,000 to 200,000.

3. A resin obtained by heat-curing a blend of an organic peroxide with a composition comprising 100 parts by weight of a butadiene polymer containing in its polymer chain at least 50 mol% of 1,2-butadiene units having a double bond in each unit in its side chain, from 10–100 parts by weight of a vinyl compound having at least three vinyl groups in one molecule selected from the group consisting of trimethylolpropane triacrylate, trimethylolpropane trimethacrylate, triallyltrimellitate, trihydroxyethylisocyanuric acid triacrylate and trihydroxyethylisocyanuric acid trimethacrylate and at least one member selected from the group of compounds of formulas I–IV:

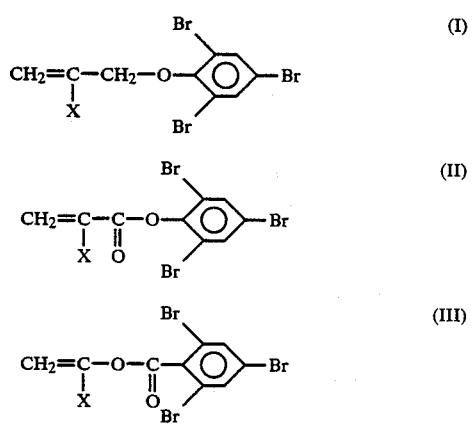

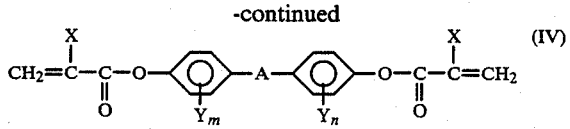

wherein X is H or CH₃, Y is Br or Cl, A is —, —O—, —CO—, —SO₂—, —CH=CH—, —C(CH₃)₂— or —(CH₂)$_a$—, and each of m, n and a is an integer of from 1 to 4, in an amount of from 25 to 100 parts by weight in the case of the formulas I to III and from 25 to 200 parts by weight in the case of the formula IV.

4. The resin according to claim 3, wherein the butadiene polymer has a number average molecular weight of from 1,000 to 200,000.

5. The resin according to claim 2, wherein said butadiene polymer in its chain has at least 90 mol% of 1,2-butadiene units, and has a number average molecular weight of from 50,000 to 200,000.

UNITED STATES PATENT AND TRADEMARK OFFICE
CERTIFICATE OF CORRECTION

PATENT NO. : 4,882,389

DATED : Nov. 21, 1989

INVENTOR(S) : Makoto Doi, et al

It is certified that error appears in the above-identified patent and that said Letters Patent is hereby corrected as shown below:

On the title page:

The second inventor's name is incorrect, "Hiroyukio Nakajima", should be:

--Hiroyuki Nakajima--

Signed and Sealed this

Eighteenth Day of December, 1990

Attest:

HARRY F. MANBECK, JR.

Attesting Officer

Commissioner of Patents and Trademarks